United States Patent [19]

Yoshimoto et al.

[11] Patent Number: 5,111,364
[45] Date of Patent: May 5, 1992

[54] IMPACT RESISTANT LAYER FOR A CIRCUIT BOARD

[75] Inventors: Satoshi Yoshimoto, Komaki; Shigeru Nakata, Nagoya; Noboru Takama, Nagoya; Minoru Taniguchi, Nagoya, all of Japan

[73] Assignee: Brother Kogyo Kabushiki Kaisha, Japan

[21] Appl. No.: 575,331

[22] Filed: Aug. 30, 1990

[30] Foreign Application Priority Data

Sep. 28, 1989 [JP] Japan .............................. 1-115456[U]

[51] Int. Cl.$^5$ .......................... H05K 5/00; H05K 1/00
[52] U.S. Cl. ..................................... 361/399; 174/256
[58] Field of Search ........................ 361/398, 399, 395; 174/254, 255, 256, 258

[56] References Cited

U.S. PATENT DOCUMENTS

| | | | |
|---|---|---|---|
| 4,670,351 | 6/1987 | Keane et al. | 361/398 X |
| 4,677,252 | 6/1987 | Takashi et al. | 361/398 X |
| 4,688,020 | 8/1987 | Kuehneman et al. | |
| 4,858,071 | 8/1989 | Manabe et al. | 361/398 X |
| 4,961,806 | 10/1990 | Gerrie et al. | 361/398 X |

FOREIGN PATENT DOCUMENTS 0259958 3/1988 European Pat. Off. .

OTHER PUBLICATIONS

"Elastomers", J. P. Mathews, Machine Design 1971 Plastics/Elastomers Reference Issue, Feb. 11, 1971, pp. 154–166.
"Bubble-Free Protective Coating", D. R. McGough, IBM Technical Disclosure Bulletin, Dec., 1963, vol. 6, No. 7, p. 4.

Primary Examiner—Leo P. Picard
Assistant Examiner—Michael W. Phillips
Attorney, Agent, or Firm—Oliff & Berridge

[57] ABSTRACT

A resist film for protecting a circuit pattern is coated onto a circuit pattern formed on a circuit board, and further, a part of the resist film with which another unit comes into contact is coated with a thermosetting film. Namely, the other unit is brought into contact with a part of the circuit pattern coated with the thermosetting film, and thus, the other unit and the resist film do not come into contact with each other directly, regardless of whether or not the other unit has a high temperature.

7 Claims, 3 Drawing Sheets

IMPACT RESISTANT LAYER FOR A CIRCUIT BOARD

BACKGROUND OF THE INVENTION

1. Field of the Invention

The present invention relates to a circuit board with a circuit pattern formed thereon and coated with a resist film for protecting the surface thereof.

2. Description of the Related Art

Usually, a circuit board is provided with a circuit pattern formed thereon and a protective resist film is coated on the surface thereof to prevent oxidation of the circuit pattern. The resist layer is a thin polymer coating designed to prevent both oxidation and shorting of the circuit pattern. Oxidation could raise the resistance of the exposed circuit line significantly, or cause the circuit line to break completely, creating an open circuit condition. At the same time, due to the proximity of adjacent circuit lines, shorting between the circuit lines could arise from contamination by environmental debris. Further, the resist layer has no durability against environmental damage.

In a conventional circuit board, however, when another unit is brought into contact with the resist film, the resist film is easily damaged by the impact with the other unit, and as a result, the circuit pattern formed on the board is directly exposed to the outside air and is oxidized, or is broken by the impact of the contact with the other unit. When the other unit brought into contact with the resist film has a temperature of 70° C. or more, the resist film may be melted by the heat radiated by the other unit. Furthermore, it is possible that the resist film will absorb water when used in humid or damp environments, and thus become soft. In this case, the resist film is more readily damaged by the other unit, and is easily peeled from the circuit pattern.

The circuit board as described above is generally used for a keyboard, electronic equipment or the like (as disclosed in Japanese Unexamined Patent Publication No. 63-20613 laid open on Jan. 28, 1988, which corresponds to U.S. patent continuation application Ser. No. 07/489,874 filed on Mar. 6, 1990 and assigned to the same assignee as that of the present application, which is a continuation of patent application Ser. No. 07/072,400 filed on Jul. 13, 1987 and now abandoned) and thus a circuit board having a greater durability and reliability is required.

SUMMARY OF THE INVENTION

An object of the present invention is to provide a circuit board wherein damage to a resist film coated thereon by contact with another unit can be prevented.

Another object of the present invention is to provide a circuit board wherein damage to a resist film coated thereon can be prevented when the board is used together with another unit.

A further object of the present invention is to provide a circuit board wherein a circuit pattern can be protected from external adverse influences by a strong protective film.

To achieve the above objects in a circuit board according to the present invention, a resist film for protecting a circuit pattern is coated onto the circuit pattern formed on the board, and further, a part of the resist film with which the other unit comes into contact is coated with a thermosetting film. Namely, the other unit is brought into contact with a part of the circuit pattern coated with the thermosetting film, and thus, the other unit and the resist film do not come into direct contact with each other, regardless of whether or not the other unit has a high temperature. As a result, damage to or peeling of the resist film due to contact thereof with the other unit can be prevented, and further, exposure or breakage of the circuit pattern protected by the resist film can be prevented. Accordingly, a circuit board having a far greater durability and reliability can be obtained.

BRIEF DESCRIPTION OF THE DRAWINGS

A preferred embodiment of the present invention will be described in detail with reference to the accompanying drawings, in which.

DESCRIPTION OF THE PREFERRED EMBODIMENT

A circuit board embodying the present invention will be described hereinafter with reference to FIGS. 1 through 3.

Figure 1:
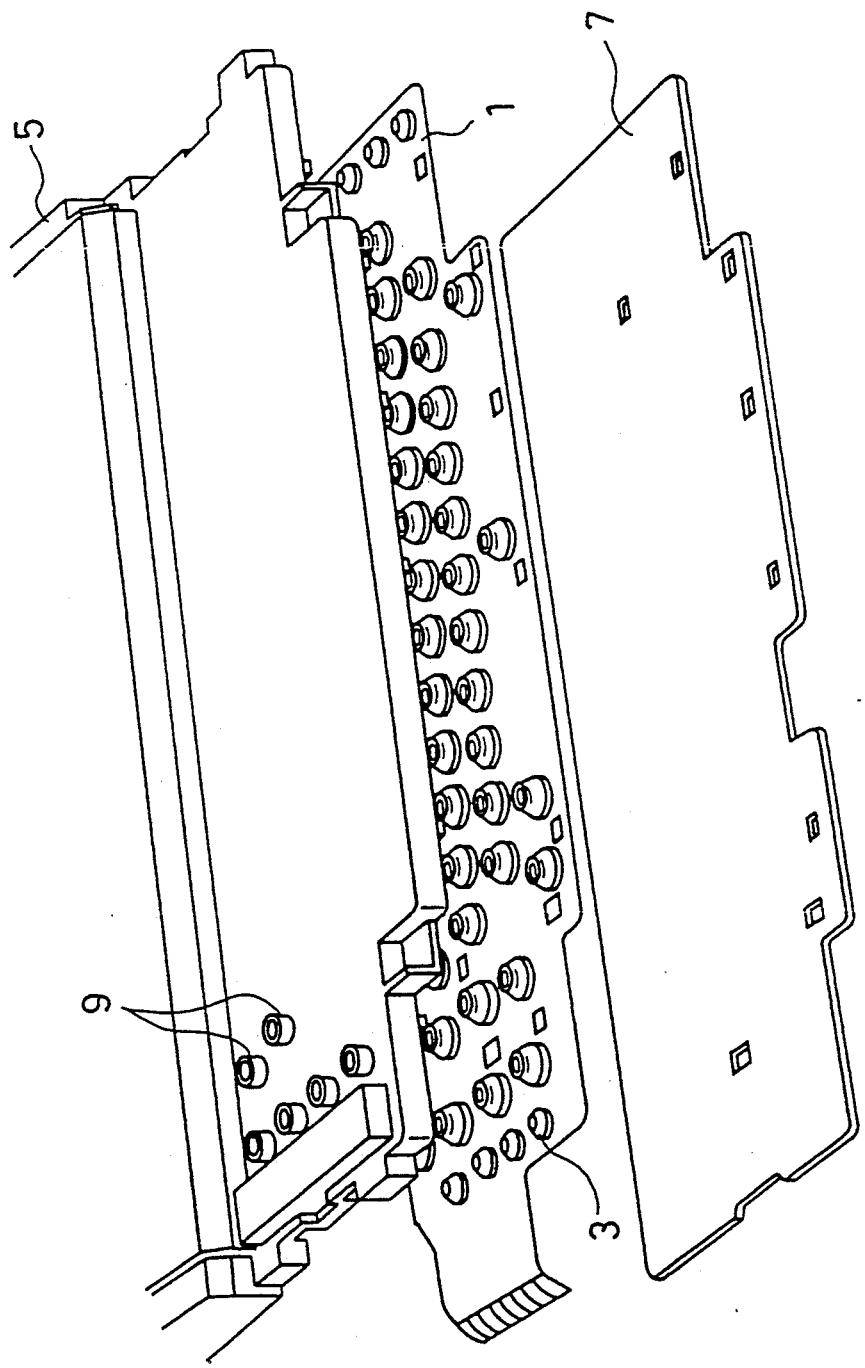
FIG. 1 is an exploded perspective view of the arrangement of a circuit board according to the present invention.

In FIG. 1, reference numeral 1 denotes a circuit board or a flexible printed circuit (hereinafter, abbreviated to "FPC"). Pairs of fixed contacts constituting key switches are formed on the FPC 1 and covered by domed elastomeric contact rubbers 3, preferably of a silicone rubber. A movable contact 4 (FIG. 2) made of conductive rubber, which is opposed to the fixed contact formed on the FPC 1, is fixed to the lower surface of the contact rubber 3 in such a manner that, when the contact rubber 3 is pressed down, the fixed contact is brought into contact with the movable contact 4, to thereby become conductive.

A keyboard panel 5 and a steel plate 7 are disposed above and under the FPC 1, respectively to define an intermediate keyboard housing for the FPC 1. Key guides 9 are formed on the keyboard panel 5 in corresponding to the locations of the contact rubbers 3 arranged on the FPC 1. The intermediate keyboard housing may be used as a keyboard component when combined with a typewriter or the like, and well-known key tops, as disclosed in U.S. Pat. No. 4,688,020, by which an operator operates key switches, are arranged on the keyboard panel 5. The key tops are held in a vertically movable manner by the key guides 9, such that when the key top is pushed down by the operator, the contact rubber 3 is also pushed down and thus the movable contact 4 is brought into contact with the fixed contact, to thereby supply power to the key switch. The FPC 1 is held between the keyboard panel 5 and the steel plate 7.

The laminated structure of the FPC 1 will be explained hereunder with reference to FIG. 2. The lowermost layer of the FPC 1 is a flexible base film 11 having sufficient durability to allow the use thereof as a board. A wiring pattern 13 is formed on the base film 11, and further, a resist film 15 is thinly coated on the wiring pattern 13 to prevent oxidation and shorting thereof. A preferred material for forming the resist film 15 is an insulating material of acrylic resin. Furthermore, to enable a simple manufacturing process, the resist film 15 is formed of an ultraviolet-ray-curable material.

Further, the resist film 15 is coated with a layer of silicone adhesive 17, including a ring-shaped portion 17a for adhering the rim 3a of the domed contact rubber 3 on the circuit board. The silicone adhesive 17 is applied to predetermined regions 17b outward from a ring shaped portion 17a. One adhesive material which has been found useful for this purpose is a flexible thermosetting silicone elastomer marketed by JUJO Chemical Co. Ltd. under the name Jelcon SRV-BR(A)(B).

After the elapse of a predetermined time from when the silicone adhesive 17 is applied onto the resist film 15, the adhesive cures and thus a thin film thereof is obtained. The silicone adhesive 17 has an elasticity, a specific durability against an external force, a hardness, and a thermosetting property; the hardness ensures an increased durability of the film under higher temperatures.

Figure 2:
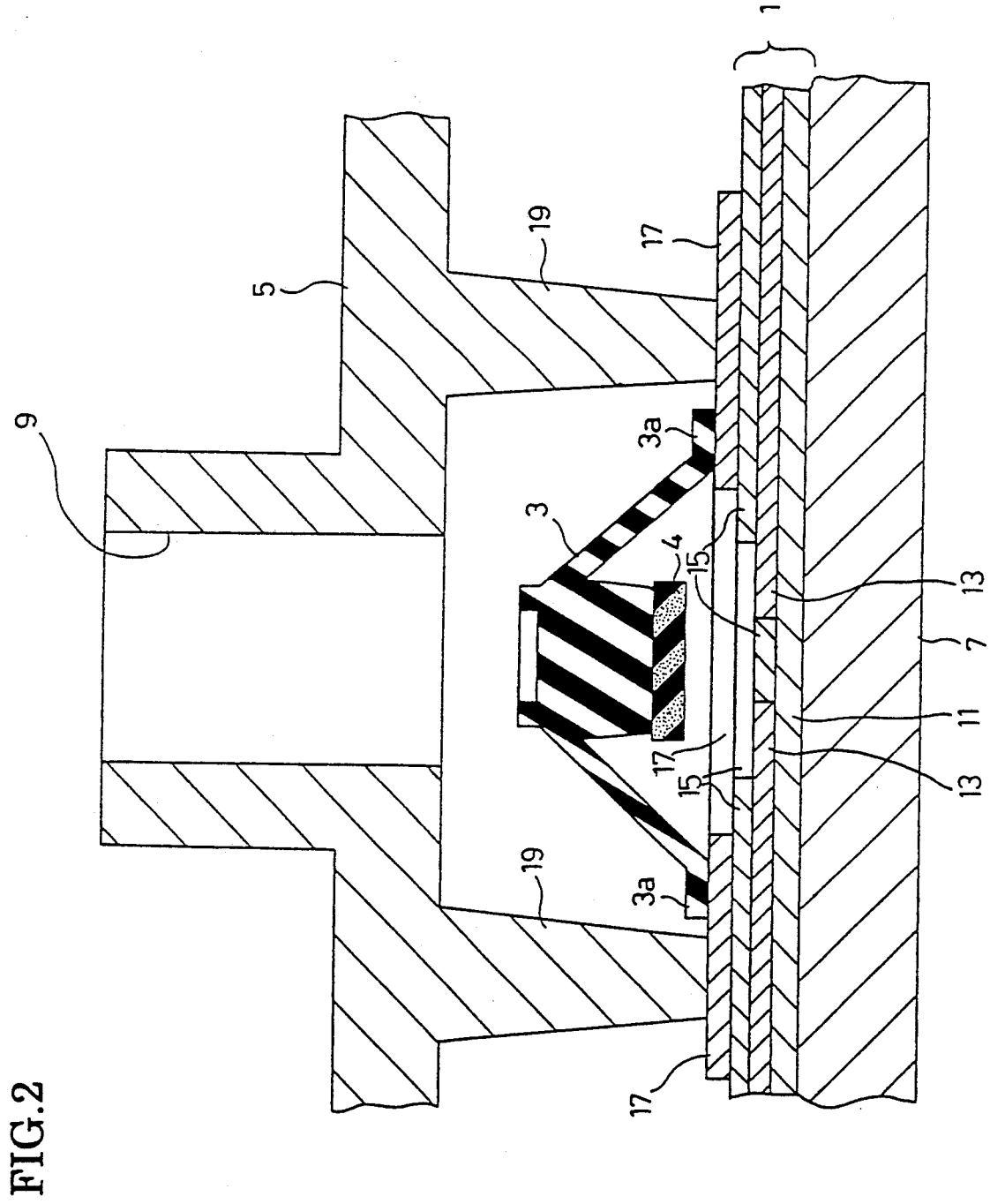
FIG. 2 is a sectional view showing a laminated structure of a circuit board.
Figure 3:
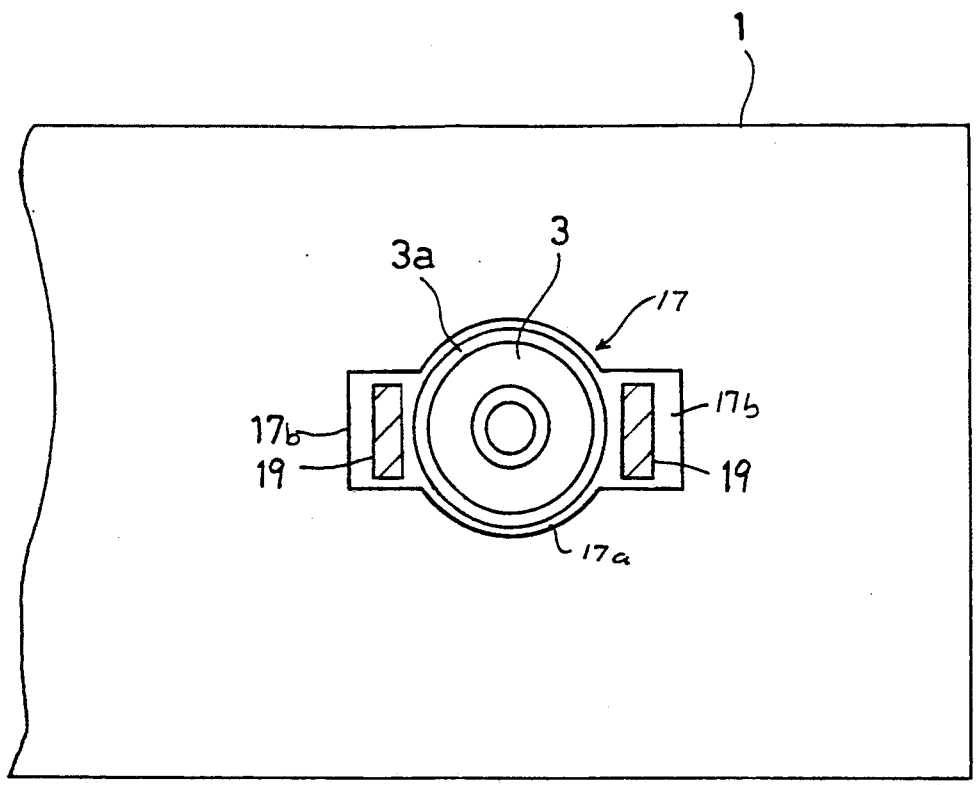
FIG. 3 is a top plan view of a circuit board taken through the keyboard panel supporting legs.

As described above, the FPC 1 is held between the keyboard panel 5 and the steel plate 7, as shown in FIG. 2, and the FPC is pressed against the steel plate 7 near the contact rubber 3 by legs 19 extending from the lower surface of the keyboard panel 5 at a point at which the key guide 9 is formed. As shown in FIG. 3, a part of the FPC 1 in direct contact with the legs 19 is coated with the silicone adhesive 17 at portions 17b, to prevent damage to the resist film 15 and exposure or breakage of the wiring pattern 13 by the pressure of the legs 19.

The silicone adhesive 17 is applied onto the FPC 1, and as a result, the surface of the FPC 1 including the resist film 15 is protected from the impact of an external force by the film formed of the adhesive 17. The film of silicone adhesive 17 has a thermosetting property, as described above, and therefore, if the keyboard panel 5 is at a high temperature, the hardness of the film is maintained, and thus the surface of the FPC 1 can be protected even at a high temperature. Note, since the resist film 15 is easily melted at a high temperature, the film of the silicone adhesive 17 may come into contact with the wiring pattern 13. Accordingly, the silicone adhesive 17 is made of an insulating material, to prevent a shorting of the wiring pattern 13 if the resist film 15 is melted. If the resist film 15 absorbs water and is thus softened, and accordingly, is easily peeled from the wiring pattern 13, the wiring pattern 13 together with the resist film 15 can be protected from the impact of an external force by the film of silicone adhesive 17. Consequently, the wiring pattern 13 can be completely protected against the mechanical pressure and heat transmitted from the legs 19, by the film of silicone adhesive 17 and the resist film 15, and thus will not be shorted or broken.

What is claimed is:

1. A circuit board comprising:
   a base film;
   a circuit pattern formed on the base film;
   a resist layer coated on the circuit pattern for protecting the circuit pattern; and
   an exterior thermosetting layer coated on at least a portion of the resist layer, the thermosetting layer having an interior surface contacting the resist layer and an exterior surface exposed over the entire thermosetting layer for protecting the underlying resist layer and circuit pattern layer from wear.

2. A circuit board as in claim 1 wherein the thermosetting material is a silicone.

3. A circuit board as in claim 1 wherein the resist layer is an acrylic resin.

4. A circuit board as in claim 1, wherein the base film is flexible and said thermosetting layer is flexible.

5. An electronic control element comprising:
   an intermediate housing comprising a top cover and an intermediate base plate;
   a circuit board within said intermediate housing, said circuit board comprising:
   a base film;
   a circuit pattern formed on the base film;
   a layer of resist material on the base film overlying the circuit pattern; and
   an exterior layer of thermosetting material on at least a portion of the resist layer for protecting the underlying layers from wear, the thermosetting layer having an interior surface contacting the resist layer and an exterior surface exposed over the entire thermosetting layer;
   means on the housing for engaging said circuit board; and
   said thermosetting material being disposed on portions of the resist layer where the engaging means engages said circuit board.

6. Apparatus as in claim 5, wherein the thermosetting material is a flexible silicone.

7. Apparatus as in claim 6, wherein the resist material is an acrylic resin.

* * * * *